(12) United States Patent
Tsukamoto

(10) Patent No.: US 9,711,336 B2
(45) Date of Patent: Jul. 18, 2017

(54) BACKING PLATE-INTEGRATED METAL SPUTTERING TARGET AND METHOD OF PRODUCING SAME

(71) Applicant: JX Nippon Mining & Metals Corporation, Tokyo (JP)

(72) Inventor: Shiro Tsukamoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 14/779,345

(22) PCT Filed: Sep. 5, 2014

(86) PCT No.: PCT/JP2014/073504
§ 371 (c)(1),
(2) Date: Sep. 23, 2015

(87) PCT Pub. No.: WO2015/037533
PCT Pub. Date: Mar. 19, 2015

(65) Prior Publication Data
US 2016/0071705 A1 Mar. 10, 2016

(30) Foreign Application Priority Data
Sep. 12, 2013 (JP) ................................. 2013-189387

(51) Int. Cl.
*C23C 14/34* (2006.01)
*H01J 37/34* (2006.01)
*B21K 23/04* (2006.01)

(52) U.S. Cl.
CPC ...... *H01J 37/3417* (2013.01); *C23C 14/3407* (2013.01); *C23C 14/3414* (2013.01);
(Continued)

(58) Field of Classification Search
CPC . B21K 23/04; C23C 14/3407; C23C 14/3414; H01J 14/3417; H01J 37/3423;
(Continued)

(56) References Cited

U.S. PATENT DOCUMENTS 8,061,177 B2 11/2011 Jepson
2004/0016635 A1 1/2004 Ford et al.
(Continued)

FOREIGN PATENT DOCUMENTS

JP S62-045440 A1 2/1987
JP 09-104972 * 4/1997
(Continued)

*Primary Examiner* — Rodney McDonald
(74) *Attorney, Agent, or Firm* — Howson & Howson, LLP

(57) ABSTRACT

Provided is a backing plate-integrated metal sputtering target comprising a flange part that is formed integrally with a target of which periphery becomes a backing plate, wherein the flange part comprises a structure obtained by repeating partial forging. By increasing the mechanical strength of only the flange part of the target in a backing plate-integrated sputtering target as described above, it is possible to inhibit the deformation of the target during sputtering and a change in the conventional sputtering properties; thereby the formation of thin films having superior uniformity can be realized, and the yield and reliability of semiconductor products, which are being subject to further miniaturization and higher integration, can be improved.

10 Claims, 2 Drawing Sheets

(52) U.S. Cl.
CPC ...... *H01J 37/3423* (2013.01); *H01J 37/3426* (2013.01); *H01J 37/3435* (2013.01); *H01J 37/3491* (2013.01); *B21K 23/04* (2013.01)

(58) Field of Classification Search
CPC . H01J 37/3426; H01J 37/3435; H01J 37/3491
USPC ........................................ 204/298.12, 298.13
See application file for complete search history.

(56) References Cited

U.S. PATENT DOCUMENTS

| | | | |
|---|---|---|---|
| 2007/0215463 A1* | 9/2007 | Parkhe | C23C 14/3414 204/298.12 |
| 2011/0056828 A1* | 3/2011 | Miao | B21C 23/001 204/298.13 |
| 2013/0220805 A1 | 8/2013 | Tsukamoto et al. | |
| 2013/0306467 A1 | 11/2013 | Miao et al. | |
| 2014/0110849 A1 | 4/2014 | Otsuki et al. | |
| 2014/0318953 A1 | 10/2014 | Nagata et al. | |

FOREIGN PATENT DOCUMENTS

| | | |
|---|---|---|
| JP | H09-209133 A | 8/1997 |
| JP | 2002-121662 A | 4/2002 |
| JP | 2002-161360 A | 6/2002 |
| JP | 2006-161101 A | 6/2006 |
| WO | 2012/117853 A1 | 9/2012 |
| WO | 2013/047199 A1 | 4/2013 |

\* cited by examiner

BACKING PLATE-INTEGRATED METAL SPUTTERING TARGET AND METHOD OF PRODUCING SAME

BACKGROUND

The present invention relates to a sputtering target for use in forming thin films of semiconductor devices. In particular, the present invention relates to a metal sputtering target integrated with a backing plate, and a method of producing the same. The term "metal target" includes targets made from metal and made from alloy. In particular, in the case of a titanium target, this includes a titanium alloy target.

In recent years, film deposition is being performed for various electronic components by using metal or alloy sputtering targets. In particular, the use of titanium (titanium alloy) sputtering targets is increasing.

Generally speaking, a sputtering target is often bonded with a backing plate by using a bonding material or the like, and after using the target, it is necessary to stop the sputtering equipment to replace the spent target with a new one. Nevertheless, this downtime deteriorates the production efficiency.

Thus, in order to shorten the downtime as much as possible and reduce the manufacturing cost, there are demands for producing a target integrated with a backing plate in order to increase the thickness of the target itself. Nevertheless, this type of integrated target has a drawback in that, because the mechanical strength is insufficient, the target is subject to deformation such as warping during the sputtering process.

In order to resolve this kind of drawback, for instance, Patent Document 1 discloses a technology of producing an integrally-structured target in which the target and the backing plate are produced with the same material, wherein, by subjecting the target to plastic working in order to increase the mechanical strength, the target will not be subject to warping or other deformation even when sputtered at a high power.

Nevertheless, when the plastic working conditions are changed in order to increase the mechanical strength of the overall target, the sputtering properties of the target itself will change, and there is a problem in that the intended product performance cannot be satisfied.

Patent Document 2 describes a technology of causing the non-erosion portion of the sputtering target to be irradiated with a laser so as to form a recess, and causing the hardness of the bottom face of such recess to be smaller than the hardness of the surface of the non-erosion portion in order to prevent the generation of coarse particles. Nevertheless, since this technology softens the melt portion via laser irradiation and causes the hardness of the bottom face of the recess to be smaller in comparison to the hardness of the surface of the non-erosion portion, Patent Document 2 does not aim to inhibit the deformation of the target during sputtering by increasing the strength of the target.

Patent Document 3 provides an aluminum or aluminum alloy sputtering target and a method of producing such a target. Pure aluminum or aluminum alloy is mechanically processed into a round blank, and the blank is subject to recrystallization heat treatment in order to realize the required crystal grain size and crystal texture. After this heat treatment step, additional strain of 10 to 50% is applied to the blank in order to increase the mechanical strength. Furthermore, strain in the flange area of the target is larger than the strain in the other target areas, and strain is applied to the flange area at a ratio of approximately 20 to 60%. Subsequently, the blank is subject to finishing processing to obtain a sputtering target possessing the required crystal texture and sufficient mechanical strength.

Patent Document 4 describes a backing plate-integrated sputtering target in which the Vickers hardness Hv of the flange part is 90 or more, and the 0.2% yield stress of the flange part is $6.98 \times 10^7$ N/m$^2$ or more.

While foregoing Patent Document 3 and Patent Document 4 describe a backing plate-integrated sputtering target, since their production conditions require the flange part to be simultaneously subject to plastic working, strain is applied from the periphery to the center part of the target pursuant to the plastic working of the flange part, and there is a problem in that there may be variations in the hardness of the target.

Patent Document 1: JP 2002-121662 A
Patent Document 2: JP H09-209133 A
Patent Document 3: JP 2012-515847 A
Patent Document 4: International Publication No. WO 2013/047199

SUMMARY

An object of the present invention is to provide a backing plate-integrated sputtering target in which, by increasing the mechanical strength of only the flange part of the target, it is possible to inhibit the deformation of the target during sputtering and a change in the conventional sputtering properties; thereby the formation of thin films having superior uniformity can be realized, and the yield and reliability of semiconductor products, which are being subject to further miniaturization and higher integration, can be improved.

In particular, an object of the present invention is to provide a backing plate-integrated metal sputtering target, wherein the Vickers hardness Hv of the flange part that acts as a backing plate in the backing plate-integrated titanium sputtering target is 110 or more and the hardness of the sputtering surface of the titanium target is uniform.

The present invention can achieve the foregoing object by providing the following invention.

1) A backing plate-integrated metal sputtering target comprising a flange part that is formed integrally with a target of which periphery becomes a backing plate, wherein the flange part comprises a structure obtained by repeating partial forging.

2) The backing plate-integrated metal sputtering target according to 1) above, wherein an outer periphery of the target after forging is machined to eliminate portions containing strain resulting from forging.

3) The backing plate-integrated metal sputtering target according to 1) or 2) above, wherein the backing plate-integrated metal sputtering target is of a disk shape, an oval shape or a rectangular shape.

4) The backing plate-integrated metal sputtering target according to any one of 1) to 3) above, wherein the backing plate-integrated metal sputtering target is made from titanium or titanium alloy, and Vickers hardness Hv of the flange part that acts as a backing plate is 110 or more.

The present application additionally provides the following invention.

5) A method of producing a backing plate-integrated metal sputtering target, wherein, upon forging a flange part that acts as a backing plate, partial forging is performed, and the flange part is obtained by ultimately forging an entire outer periphery of a material.

6) The method of producing a backing plate-integrated metal sputtering target according to 5) above, wherein ⅕ or less of an entire perimeter of a metal material is processed in a single forging operation.

7) The method of producing a backing plate-integrated metal sputtering target according to 5) or 6) above, wherein an outer periphery of the target is machined after forging to eliminate portions containing strain resulting from forging.

8) The method of producing a backing plate-integrated metal sputtering target according to any one of 5) to 7) above, wherein the backing plate-integrated metal sputtering target is molded into a disk shape, an oval shape or a rectangular shape.

9) The method of producing a backing plate-integrated metal sputtering target according to any one of 5) to 8) above, wherein the backing plate-integrated metal sputtering target is made from titanium or titanium alloy, and Vickers hardness Hv of the flange part that acts as a backing plate is 110 or more.

The backing plate-integrated sputtering target of the present invention yields superior effects in which, by increasing the mechanical strength of only the flange part of the target, it is possible to inhibit the deformation of the target during sputtering and a change in the conventional sputtering properties; thereby the formation of thin films having superior uniformity can be realized, and the yield and reliability of semiconductor products, which are being subject to further miniaturization and higher integration, can be improved.

In particular, the present invention yields a superior effect of being able to provide a backing plate-integrated metal sputtering target in which the Vickers hardness Hv of the flange part that acts as a backing plate in the backing plate-integrated titanium sputtering target is 110 or more and the hardness of the sputtering surface of the titanium target is uniform.

DETAILED DESCRIPTION

Figure 1:
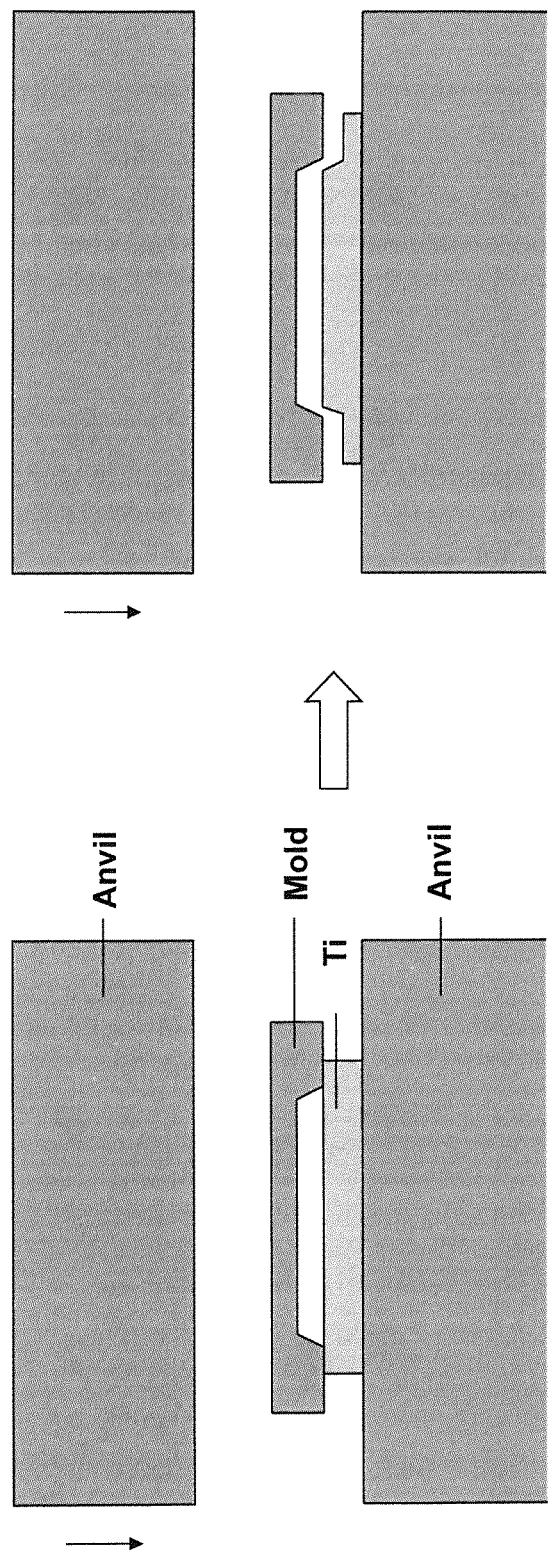
FIG. 1 This is a diagram showing the process of conventional forging (die forging).

In the present invention, the term "backing plate-integrated sputtering target" means that a sputtering target and a backing plate are monolithic and produced from the same material. With a conventional two-piece product consisting of a sputtering target and a backing plate, since the mechanical strength can be retained by means of the backing plate, it does not encounter the problem of the target undergoing deformation (warping or the like) during sputtering even if the mechanical strength becomes insufficient as encountered in the present invention. The problem of deformation becomes notable when the sputtering target and the backing plate are monolithic and sufficient thickness is achieved as in the present invention.

Nevertheless, with a conventional two-piece product consisting of a sputtering target and a backing plate, the sputtering target and the backing plate are often bonded using a bonding material or the like, but after using the target, it is necessary to stop the sputtering equipment to replace the spent target with a new one, and this downtime deteriorates the production efficiency.

Moreover, while there are demands for integrally forming the target and the backing plate and increasing the thickness of the target itself in order to reduce the manufacturing cost, since the backing plate is in itself a separate item, there is a problem in that the thickness of the target is restricted by the thickness of the backing plate.

The present invention provides a backing plate-integrated metal sputtering target comprising a flange part that is formed integrally with a target of which periphery becomes a backing plate, wherein the flange part comprises a structure obtained by repeating partial forging. Generally speaking, the target and the backing plate are each produced as separate items, and these are ultimately assembled (by bonding via welding or the like as needed), but the present invention uses the same material to realize a monolithic structure. In other words, the target material and the backing plate material before being processed (forged) in the present invention have the same component composition and structure.

As described above, the flange part of the present invention comprises a structure obtained by repeating partial forging, and this structure is substantially a forged structure. Nevertheless, partial forging generates less strain in comparison to the case of performing forging all at once, and is characterized in that the strain applied to the target can be considerably reduced in comparison to the conventional forging method (method of performing forging all at once).

The flange part is a joint for mounting the backing plate-integrated target on the sputtering equipment, and the flange part itself is never subject to sputtering. The portion corresponding to the flange part is sequentially processed, and the surface level of each processed site will become lower than the target. The flange part is in a range of roughly 20% from the maximum diameter of the backing plate-integrated target, but this may be arbitrarily determined according to the size of the backing plate-integrated target, and the range thereof may also be set to be in a range of 10 to 30%.

If the mechanical strength (hardness) of the overall target is insufficient, this is undesirable since the target will be subject to warping during sputtering and the film thickness uniformity will deteriorate. Accordingly, the hardness of the sputtering surface of the target being uniform is an important requirement in order to perform uniform sputtering.

A target is generally produced based on the process shown in FIG. 1. A backing plate-integrated sputtering target is produced, for instance, by casting metal or alloy obtained through melting to prepare an ingot (billet), forging the prepared ingot at a predetermined forging ratio, and thereafter rolling the forged ingot at a predetermined rolling reduction to obtain a rolled plate.

In addition, the periphery of the rolled plate (corresponds to the flange part) is forged (hammering, die forging, etc.) to increase the mechanical strength. In other words, as shown in FIG. 1, a metal target raw material (Ti material in FIG. 1) is placed on an anvil, a mold having a hollow space is placed thereon, pressing is performed with the anvils, and the flange part is molded by die forging.

In order to produce the flange part, which will become the backing plate portion, as described above, if the entire perimeter of the target raw material undergoes deformation resulting from forging (plastic working) at once, the generation of strain will increase, and such strain will also be generated on the sputtering surface of the target. When this strain exists at the periphery of the target, a hardness difference will arise between the center and periphery of the target, and cause variation in the hardness of the target.

This variation in the hardness of the target will affect the sputtering properties. The periphery of the target containing such strain needs to be removed via machining. As the generated amount of strain increases, the amount that needs to be removed from the periphery of the target will increase, and this will cause deterioration in the yield and increase in the production cost.

Figure 2:
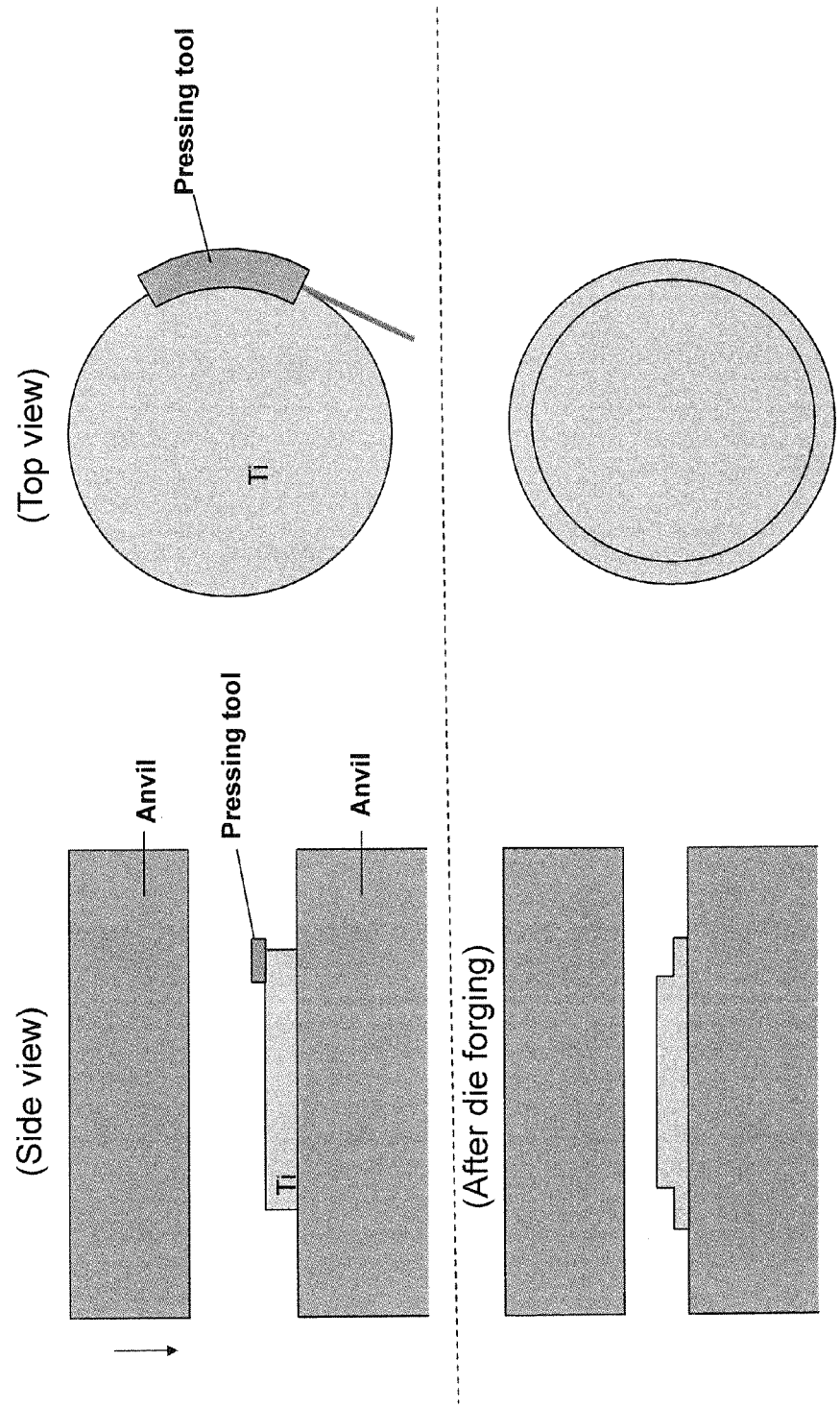
FIG. 2 This is a diagram showing the process of forging of the present invention.

Thus, in the present invention, upon forging to form the flange part that acts as a backing plate as described above, the outer periphery of the metal material is partially processed in each forging operation in order to form the flange part. Specifically, as shown in FIG. 2, the pressing tool is not applied to the entire portion of forming the flange, but rather applied partially to perform the press. By performing this kind of partial forging (partial pressing), the strain generated at the target periphery decreased significantly. Moreover, the non-pressed portion can also be subject to pressing by rotating the target.

In other words, upon molding the flange part that acts as a backing plate, the outer periphery of the metal material is partially subject to forging pressing in the first forging operation, the mold is subsequently rotated so that another area on the outer periphery of the metal material is subject to partial forging, and this is repeated until the entire periphery is ultimately forged to produce the flange part.

The amount of strain that is generated in the target can be reduced with a single forging operation, and even when forging is additionally performed to the entire perimeter of the target, since this is a repetition of the small amount of strain that is generated in a single forging operation, the generation of strain on the target periphery can be significantly reduced.

The size and frequency of forging can be arbitrarily adjusted by changing the size of the pressing tool. In other words, a backing plate-integrated metal sputtering target can be produced by performing forging multiple times.

Preferably, 1/5 or less of the entire perimeter of the metal material is processed in a single forging operation, and more preferably 1/6 to 1/8. Moreover, after forging, the outer periphery of the target can be machined to eliminate the portion containing the strain resulting from forging, and the method of producing a backing plate-integrated metal sputtering target according to the present invention can considerably reduce the amount to be machined.

Normally, the portion where strain are generated on the sputtering surface of the target as a forged product is within 3 mm from the outer periphery, and it could be said that the amount to be machined and removed is extremely small.

In the manner described above, by processing a peripheral surface to form a flange part that is lower than the surface of the target and acts as a backing plate, a backing plate-integrated metal sputtering target in which the hardness of the sputtering surface of the target is uniform is obtained.

Generally speaking, a backing plate-integrated metal sputtering target is of a disk shape, but it may also be molded in an oval shape or a rectangular shape. In the case of applying this process to a backing plate-integrated sputtering target made from titanium or titanium alloy, the Vickers hardness Hv of the flange part that acts as a backing plate can be made to be 110 or more, and the hardness of the sputtering surface can be made to be uniform. While the forging conditions can be arbitrarily decided according to the material, for instance, in the case of producing a backing plate-integrated sputtering target made from titanium or titanium alloy, the heating temperature during forging can be set to 700° C. or less, and the forging reduction can be set to 10% or more.

In addition, by increasing the mechanical strength of the flange part to inhibit warping of the target during sputtering, and eliminating residual strain on the sputtering surface of the target as described above, the sputtering properties can be stabilized.

The same applies to cases where other metals (including alloys) are used, and by performing the forging of the present invention according to the material properties of the respective metals (alloys), significant advantages are yielded in that it is possible to increase the mechanical strength of the flange part and inhibit the warping of the target during sputtering. Moreover, in the same manner, it is possible to reduce the residual strain on the sputtering surface of the target, stabilize the sputtering properties, and improve the yield of the target.

It could be said that the improvement of the foregoing properties is an attribute that is common to the backing plate-integrated metal sputtering target of the present invention and the method of producing such a target.

The present invention is now explained based on the following Examples. These Examples are described for facilitating the understanding of the present invention, and are not intended to limit the present invention in any way. In other words, modifications and other examples based on the technical concept of the present invention are also covered by the present invention as a matter of course.

Example 1

A rolled plate for a Ti one-piece target was subject to forging based on the partial pressing explained above with reference to FIG. 2. The heating temperature of titanium was 500° C., and the forging reduction of the flange part was 30%. While the hardness of the center portion of the sputtering surface was Hv=100, the hardness of the flange part based on plastic deformation was Hv=110 to 140. The hardness of the periphery of the sputtering surface in a range of 2.0 mm from the outermost periphery was Hv=110 or more due to the strain resulting from forging.

Hardness of the flange part was measured at four locations every 90°. Specifically, while rotating the measurement position every 90° along the flange part, measurement was performed, respectively, at the midst of the length of the rotated part of the flange.

The hard portion of the outermost periphery of the target was removed via finishing processing. The amount of such removed portion was an extremely small in comparison to conventional technologies, and the effect of this Example was extremely high.

As a result of performing sputter evaluation, the uniformity was favorable at approximately 4%, and the number of particles was also small at 7 particles/wafer. The warping of the target after use was 0.1 mm, and a favorable Ti sputtering target was obtained.

Example 2

A rolled plate for a Ti one-piece target was subject to forging based on the partial pressing explained above with reference to FIG. 2. The titanium was in a room temperature of 25° C., and the forging reduction of the flange part was 20%.

While the hardness of the center portion of the sputtering surface was Hv=100, the hardness of the flange part based on plastic deformation was Hv=160 to 170. The hardness of the periphery of the target in a range of 3.0 mm from the outermost periphery was Hv=120 or more due to the strain resulting from forging.

The hard portion of the outermost periphery of the target was removed via finishing processing. Amount of such removed portion was an extremely small in comparison to conventional technologies, and the effect of this Example was extremely high.

As a result of performing sputter evaluation, the uniformity was favorable at approximately 4.5%, and the number of particles was also small at 6 particles/wafer. The warping of the target after use was 0.1 mm, and a favorable Ti sputtering target was obtained.

Example 3

A rolled plate for a Ti one-piece target was subject to forging based on the partial pressing explained above with reference to FIG. 2. The heating temperature of titanium was 700° C., and the forging reduction of the flange part was 30%.

While the hardness of the center portion of the sputtering surface was Hv=100, the hardness of the flange part based on plastic deformation was Hv=110 to 130. The hardness of the periphery of the target surface in a range of 1.5 mm from the outermost periphery was Hv=110 or more due to the strain resulting from forging.

The hard portion of the outermost periphery of the target was removed via finishing processing. Amount of such removed portion was an extremely small in comparison to conventional technologies, and the effect of this Example was extremely high.

As a result of performing sputter evaluation, the uniformity was favorable at approximately 5%, and the number of particles was also small at 9 particles/wafer. The warping of the target after use was 0.2 mm, and a favorable Ti sputtering target was obtained.

Example 4

A rolled plate for a Ti one-piece target was subject to forging based on the partial pressing explained above with reference to FIG. 2. The heating temperature of titanium was 500° C., and the forging reduction of the flange part was 10%.

While the hardness of the center portion of the sputtering surface was Hv=100, the hardness of the flange part based on plastic deformation was Hv=110 to 130. The hardness of the periphery of the sputtering surface in a range of 2.0 mm from the outermost periphery was Hv=110 or more due to the strain resulting from forging.

The hard portion of the outermost periphery of the target was removed via finishing processing. Amount of such removed portion was an extremely small in comparison to conventional technologies, and the effect of this Example was extremely high.

As a result of performing sputter evaluation, the uniformity was favorable at approximately 5%, and the number of particles was also small at 10 particles/wafer. The warping of the target after use was 0.2 mm, and a favorable Ti sputtering target was obtained.

Comparative Example 1

A rolled plate for a Ti one-piece target was subject to die forging based on overall press, which is a conventional method. The heating temperature of titanium was 500° C., and the forging reduction of the flange part was 30%. While the hardness of the center portion of the sputtering surface was Hv=100, the hardness of the periphery of the sputtering surface in a range of 5.0 mm from the outermost periphery was Hv=110 or more. The hard portion of the outermost periphery of the target could not be completely removed even when finishing processing was performed, and roughly 3.0 mm of the hard portion had remained.

As a result of performing sputter evaluation, the number of particles was 8 particles/wafer, and the warping of the target after use was favorable at 0.1 mm, but the uniformity was inferior at approximately 7%.

Comparative Example 2

A rolled plate for a Ti one-piece target was machined to produce a target. The hardness of both the sputtering surface and the flange part was roughly Hv=100. As a result of performing sputter evaluation, the uniformity was slightly inferior at 6%, and the number of particles was large at 13 particles/wafer. The warping of the target after use was 0.5 mm. A major problem with this Comparative Example is that many waste materials were generated due to machining, and, due to the deterioration in the strength of the flange part, considerable warping was caused by the heat generated during the sputtering process, and the uniformity deteriorated.

Comparative Example 3

A rolled plate for a Ti one-piece target was subject to die forging based on overall press, which is a conventional method. The heating temperature of titanium was 800° C., and the forging reduction of the flange part was 30%. While the hardness of the center portion of the sputtering surface was Hv=100, the hardness of the flange part was Hv=100 to 120. The hardness of the target periphery in a range of 3.0 mm from the outermost periphery was Hv=110 to 120 due to the strain resulting from forging.

As a result of performing sputter evaluation, the number of particles was 12 particles/wafer, and the warping of the target after use was considerable at 0.4 mm, and the uniformity was inferior at approximately 6%.

Sputtering in the foregoing Examples and Comparative Examples was performed based on the following sputtering conditions.

Sputtering Conditions

Power of 20 kW
Deposition of a TiN film having a thickness of 20 nm onto a $SiO_2$ substrate
Uniformity was measured with Omnimap (RS-100) manufactured by KLA-Tencor
Particles were measured with the particle counter (Surfscan SP1-DLS) manufactured by KLA-Tencor, by which particles having a size of 0.2 μm or larger were measured.

The present invention provides a backing plate-integrated sputtering target, and by increasing the mechanical strength of only the flange part of the target, it is possible to inhibit the deformation of the target during sputtering and a change in the conventional sputtering properties; thereby the formation of thin films having superior uniformity can be realized, and the yield and reliability of semiconductor products, which are being subject to further miniaturization and higher integration, can be improved.

In particular, since the present invention can provide a backing plate-integrated metal sputtering target in which the Vickers hardness Hv of the flange part is 110 or more and the hardness of the sputtering surface of the titanium target is uniform, the present invention is effective as a backing plate of a backing plate-integrated titanium sputtering target.

The invention claimed is:

1. A backing plate-integrated metal sputtering target comprising a sputtering face part and a flange part, said sputtering face and flange parts being formed integrally and said flange part being formed as a backing plate, wherein the flange part has a width of 10 to 30% of a maximum diameter of the sputtering target and a forged metallurgical structure formed by a partial forging which is a forging that forms a fraction of said flange part, the entire flange part being formed by performing a sequence of the partial forgings, and wherein the sputtering face includes a periphery part thereof which is formed by machining to remove distorted portions formed as a result of the partial forgings, the periphery part having a width of within 3 mm.

2. The backing plate-integrated metal sputtering target according to claim 1, wherein the backing plate-integrated metal sputtering target is of a disk shape, an oval shape or a rectangular shape.

3. The backing plate-integrated metal sputtering target according to claim 2, wherein the backing plate-integrated metal sputtering target is made of titanium or titanium alloy, and Vickers hardness Hv of the flange part is 110 or more.

4. A method of producing a backing plate-integrated metal sputtering target comprising a sputtering face part and a flange part, said sputtering face and flange parts being formed integrally and said flange part being formed around a perimeter of said sputtering face part, the method comprising the steps of:

providing a blank plate of a metal to be processed into a sputtering target;

selecting a periphery part of the blank plate for being processed into the flange part and being bounded by an entire perimeter of the blank plate, the periphery part having a width that is 10 to 30% of a maximum diameter of the sputtering target;

subjecting the periphery part to a sequence of partial forgings, each of the partial forgings processing a fraction of the peripheral part into a fraction of the flange part and the sequence of the partial forgings processing the entire periphery part into the entire flange part, the sequence of the partial forgings accompanying a formation of distorted portions in a periphery area of the sputtering face part; and machining the sputtering face part for removing the distorted portions to thereby produce the sputtering target, the periphery area being subject to said machining having a width of within 3 mm.

5. The method of producing a backing plate-integrated metal sputtering target according to claim 4, wherein the fraction of the periphery part is a part bounded by ⅕ or less of the entire perimeter of the blank plate.

6. The method of producing a backing plate-integrated metal sputtering target according to claim 5, wherein the backing plate-integrated metal sputtering target is shaped into a disk shape, an oval shape or a rectangular shape.

7. The method of producing a backing plate-integrated metal sputtering target according to claim 6, wherein the backing plate-integrated metal sputtering target is made of titanium or titanium alloy, and a Vickers hardness Hv of the flange part is 110 or more.

8. The method of producing a backing plate-integrated metal sputtering target according to claim 4, wherein the backing plate-integrated metal sputtering target is shaped into a disk shape, an oval shape or a rectangular shape.

9. The method of producing a backing plate-integrated metal sputtering target according to claim 4, wherein the backing plate-integrated metal sputtering target is made of titanium or titanium alloy, and a Vickers hardness Hv of the flange part is 110 or more.

10. The backing plate-integrated metal sputtering target according to claim 1, wherein the backing plate-integrated metal sputtering target is made of titanium or titanium alloy, and a Vickers hardness Hv of the flange part is 110 or more.

* * * * *